United States Patent [19]
Fujita et al.

[11] Patent Number: 5,515,333
[45] Date of Patent: May 7, 1996

[54] SEMICONDUCTOR MEMORY

[75] Inventors: Kenji Fujita, Odawara; Toshiyuki Nakao, Hadano; Hirotsugu Yamagata; Nobuyuki Saze, both of Odawara, all of Japan

[73] Assignee: Hitachi, Ltd., Tokyo, Japan

[21] Appl. No.: 262,314

[22] Filed: Jun. 17, 1994

Related U.S. Application Data

[62] Division of Ser. No. 968,334, Oct. 29, 1992, Pat. No. 5,359,569.

[51] Int. Cl.$^6$ .................................................. G06F 11/00
[52] U.S. Cl. .................... 365/229; 365/200; 365/228; 395/489; 395/492; 395/421.11; 395/182.04; 395/182.12
[58] Field of Search ..................................... 365/229, 900, 365/189.01, 228, 226; 395/489, 492, 421.11, 182.04, 182.12

[56] References Cited

U.S. PATENT DOCUMENTS 5,297,148  3/1994  Harari et al. ........................... 371/10.2
5,317,720  5/1994  Stamm et al. ........................... 395/425

*Primary Examiner*—Viet Q. Nguyen
*Attorney, Agent, or Firm*—Antonelli, Terry, Stout & Kraus

[57]  ABSTRACT

A semiconductor memory is provided which includes an electrically rewritable non-volatile semiconductor memory. A data control circuit is also provided which includes an ECC circuit and which operates to control the writing and reading operations of data to and from the non-volatile semiconductor memory. In order to temporarily hold data which is to written into the non-volatile semiconductor memory, a volatile cache semiconductor memory is utilized. This volatile cache semiconductor memory has a storage capacity which is equal to or less than the storage capacity of the non-volatile semiconductor memory itself. A data control circuit is also provided to read out data from the non-volatile semiconductor memory and the volatile cache semiconductor memory, and to transfer the data from the volatile semiconductor to the non-volatile semiconductor memory.

3 Claims, 6 Drawing Sheets

| | |
|---|---|
| 0000 ×××× | MAIN FLASH MEMORY #0    BLOCK #0 |
| | #0    #1 |
| | ⁓ |
| | MAIN FLASH MEMORY #0    BLOCK #15 |
| | #1    #0 |
| | #1 |
| | ⁓ |
| 7FFF ×××× | MAIN FLASH MEMORY #n    BLOCK #15 |
| 8000 ×××× | ALTERNATING FLASH MEMORY #0    BLOCK #0 |
| | #0    #1 |
| | ⁓ |
| BFFF ×××× | ALTERNATING FLASH MEMORY #m    BLOCK #15 |
| C000 ×××× | #CACHE MEMORY RECORD #0 |
| | #1 |
| | ⁓ |
| FFFF ×××× | #CACHE MEMORY RECORD #l |

FIG. 7

THE NUMBER OF REWRITING TIMES OF BLOCK 70    71

RECORD #0    RECORD #1    RECORD #l

DATA FORMAT OF ONE BLOCK

FIG. 8

| 0000 | CCHHR | MAIN FLASH MEMORY ADDRESS #1 | CACHE MEMORY RECORD #0 ADDRESS | |
|---|---|---|---|---|
| ⁓ | | | | |
| FFFF | CCHHR | MAIN FLASH MEMORY ADDRESS #1 | CACHE MEMORY RECORD #1 ADDRESS | |

FIG. 9

| 0000 | 0 | 0 | 0 | 0 |
|---|---|---|---|---|
| 0001 | BLOCK ADDRESS OF ALTERNATING FLASH MEMORY | | | |
| 0002 | 0 | 0 | 0 | 2 |
| 0003 | 0 | 0 | 0 | 3 |
| ⁓ | | | | |
| FFFF | | | | |

WHEN THERE IS ALTERNATION OF BLOCK

WHEN THERE IS NO ALTERNATION OF BLOCK 5,515,333

SEMICONDUCTOR MEMORY

This is a divisional of application Ser. No. 968,334, filed Oct. 29, 1992, U.S. Pat. No. 5,359,569.

BACKGROUND OF THE INVENTION

The invention relates to a semiconductor memory using an electrically rewritable non-volatile memory and, more particularly, to a technique for realizing the high speed in rewriting of data and for improving the life of a rewriting operation.

U.S. Pat. No. 4,908,793 discloses a disk storage having a battery and a semiconductor memory.

In the conventional apparatus, as disclosed in U.S. Pat. No. 4,908,793 or JP-A-63-100555, the non-volatile memory (magnetic disk) is nothing but an auxiliary memory to save data in the volatile memory (RAM) when a power source is shut off. In the ordinary operating state, data is written into or read out from the volatile memory. In JP-A-2-81398, an EEPROM is used as a non-volatile memory.

In the above conventional technique, the non-volatile memory for saving data is indispensable in spite of the fact that it is not ordinarily used and the non-volatile memory needs to have a memory capacity which is equal to or larger than that of the volatile memory. Therefore, the memory capacity which can be actually used is equal to or less than 50% of the total memory capacity of both the volatile memory and the non-volatile memory. There are problems with respect to points that efficiency of the non-volatile memory is very low and the overall costs of the memories are also expensive.

Further, in a memory device using only the magnetic disk as a non-volatile memory in order to realize a non-volatile memory device, the time which is required to read out or write data is so long as to be tens of milliseconds. In a memory device using only an EEPROM, the time which is required to read out data is so long as to be a few milliseconds. There is, consequently, a problem from a viewpoint of a high accessing speed of data. On the other hand, as for the EEPROM, up to tens of thousand of rewriting times of data are assured, so that there is also a problem in terms of the life of the memory device.

SUMMARY OF THE INVENTION

It is an object of the invention to provide a semiconductor memory device in which by improving a use efficiency of a non-volatile memory to the total memory in the semiconductor memory, low cost and a high data accessing speed can be realized, and the life of the memory device can be improved.

Another object of the invention is to provide a semiconductor storage in which in correspondence to differences of lives among a plurality of flash memory units, the unit of short life is detected to elongate the life of the operation of the whole storage.

Still another object of the invention is to provide a semiconductor memory device having a flash memory, which usually necessitates a longer time for writing than that for reading, with a memory of a sufficiently smaller capacity which makes the write time into comparative order with a read time in its total performance.

Further another object of the invention is to provide a memory device having an electrically rewritable non-volatile semiconductor memory whose writing time is so short as to seemingly be hundreds of nanoseconds for performing a high speed data transfer from a processing apparatus connected to the memory, device which actually has a writing time of a few milliseconds.

Further another object of the invention is to provide a semiconductor memory in which small volume data can be written from a CPU connected to a flash memory whose erasing and writing units are large, thereby decreasing the number of commands of combining small data volumes in the data writing operation from the CPU.

To accomplish the above objects, an electrically erasable and rewritable flash EEPROM is used as an example of a non-volatile memory. When data is written, however, the flash EEPROM needs time to previously erase data and has the data writing time longer than that of the RAM. Therefore, when data is written from a processing apparatus, the data is once stored into a high-speed RAM or a write cache memory and the data in the write cache memory as a volatile memory is written into the non-volatile memory or flash EEPROM during a time zone when the processing apparatus does not access to the semiconductor memory or as necessary. After the data was once written from the write cache memory to the flash memory, a high accessing speed can be accomplished by directly reading out the data from the flash EEPROM. It will be obviously understood that the data can be read out from or written into the write cache memory at a high speed from the processing apparatus before the data is written into the flash EEPROM. Although the above memory access is ordinarily executed, when the power source is shut off or a power failure occurs, in order to prevent the extinguishment of the data in the write cache memory, a power is supplied from a battery for a period of time which is needed to completely save the data into the flash EEPROM. The number of writing times of data per one block in flash EEPROM is limited to about $10^4$ to $10^5$ times. When the number of data writing exceeds such a limit value, a data bit defective ratio increases. Therefore, the data in the block whose life reaches the end or in which a failure occurs is stored into an auxiliary or alternating block when the number of data rewriting times reaches a predetermined value or the number of detection times of defective bits by an error correction code circuit (ECC) reaches a predetermined value, thereby assuring a high reliability of the data.

According to the above means, as the data in the flash EEPROM as a non-volatile memory is always held even when the power supply is shut off, after the power supply was turned on, the processing apparatus connected to the memory device can immediately directly read out the data from the flash EEPROM via a data control circuit at a high speed. On the contrary, the writing operation of data can be executed at a high speed by once writing into the write cache memory as a volatile memory. In this instance, since the data in the write cache memory is transferred and stored into the flash EEPROM during the time the memory is not accessed from the processing apparatus, the data is not volatilized. When an error is found out in the data read out from the flash EEPROM from correction information of the error correction code EEC added to the data or when the number of rewriting times of the block data in the flash EEPROM added to the data exceeds a limit value, the data is transferred and stored into the alternating flash EEPROM, thereby maintaining the high reliability of data for the life of memory or a failure. Further, the above memory device has the battery to supply power when the power supply is shut off or a power failure occurs, the data in the write cache memory are saved into the flash EEPROM and the write data is not extinguished.

According to the invention, the use efficiency of the memory, which is equal to or lower than 50% in the conventional technique, can be improved to 90% or more. The costs, accordingly, can be reduced to 55% or less.

DESCRIPTION OF THE PREFERRED EMBODIMENT

Figure 1:
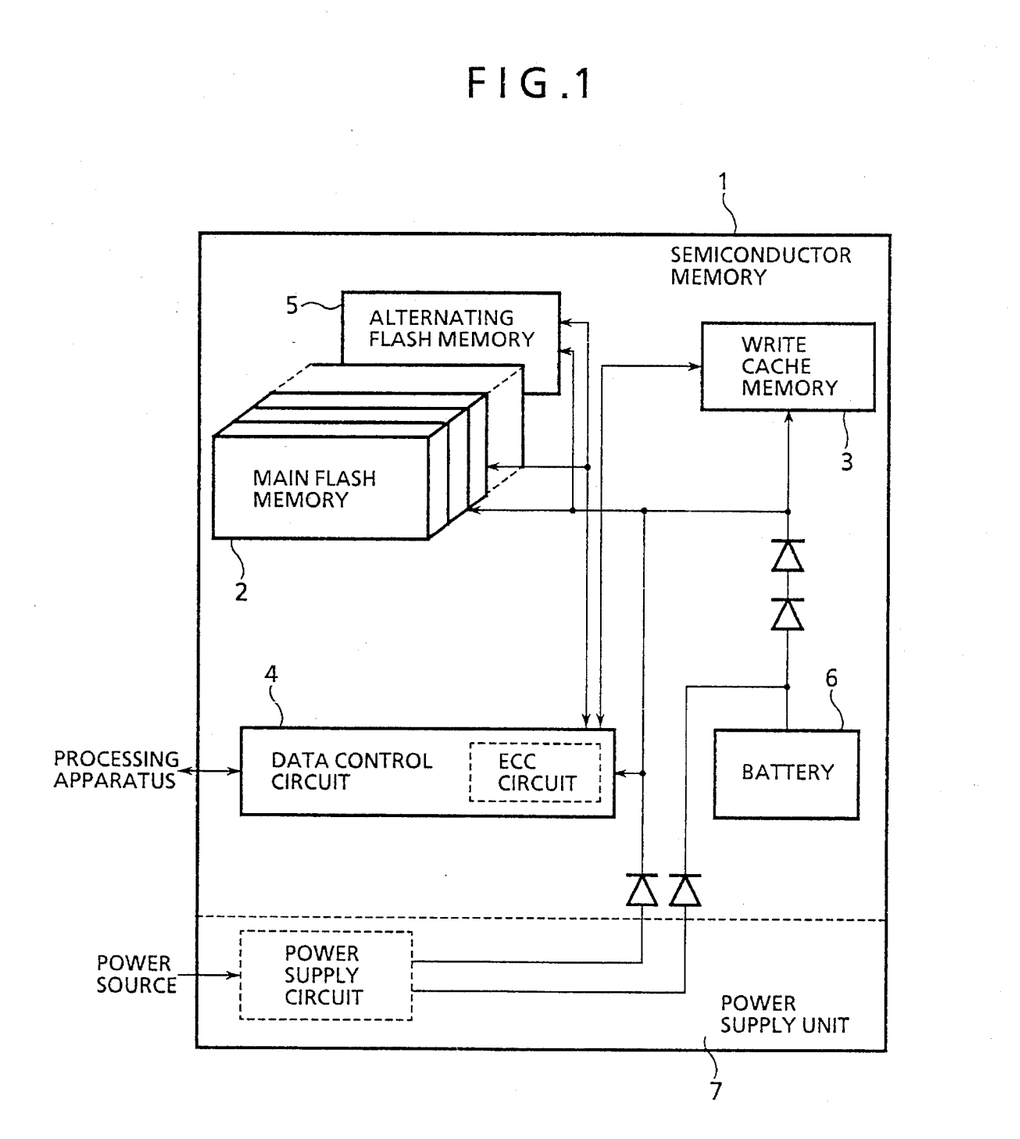
FIG. 1 is a schematic functional block diagram of a semiconductor memory according to an embodiment of the invention.

An embodiment of the invention will be described hereinbelow with reference to FIG. 1. FIG. 1 is a schematic functional block diagram of a semiconductor memory device or storage 1. The memory or the memory unit 1 comprises a main flash memory 2, a data control circuit 4, an alternating flash memory 5, a battery 6, and a power supply unit 7. When a power supply is turned on, the power supply unit 7 supplies power to each section of the semiconductor memory and also charges the battery 6. When a read instruction of data is sent from a processing apparatus, the data control circuit 4 reads out data added with an ECC (error check code) at a designated address of the main flash memory 2. When there is an error of two bits or less in the data, the data is corrected. After that, the data is transferred to the processing apparatus.

When a write instruction of data is generated from the processing apparatus, the data added with the ECC is written into a write cache memory 3 via the data control circuit 4, thereby completing the writing operation of the data into the memory when it is seen from the processing apparatus. The data written in the write cache memory 3 is written into the area at the relevant address of the main flash memory 2 by an instruction of the data control circuit 4 for a time zone during which the memory is not accessed from the processing apparatus so as not to cause an overflow of the write cache memory 3, thereby performing the non-volatilization of the data. When an access instruction from the processing apparatus is generated before completion of the writing process of the data into the main flash memory 2, the reading and writing processes are executed to the data in the write cache memory 3. The data which has been written is read out from the main flash memory 2. When a bit error of one or more bits of the data detected by the ECC circuit is found out in the data read out from the main flash memory 2 or when the number of rewriting times of the block in the main flash memory 2 reaches a limit value ($10^5$ times), the data of the block in the address in which the bit error in the main flash memory 2 was found out or the data of the block in the address in which the number of rewriting times reaches the limit value is stored in the alternating flash memory 5 in place of the main flash memory 2, thereby maintaining the reliability of the data. After that, the memory access to the data of the block in the main flash memory 2 which has been alternated is inhibited by setting a flag.

The battery 6 supplies power to the main flash memory 2, write cache memory 3, alternating flash memory 5, and data control circuit 4 in place of the power supply unit 7 when the power supply of the power supply unit 7 is shut off or a power failure occurs. By writing the data in the write cache memory 3 into the main flash memory 2 for a period of time during which the power is being supplied from the voltage source or the battery 6, it is prevented that the data is extinguished. When the power supply is shut off, the power supply from the battery is made to write the data into the flash memory. After the power failure occurred, when the power is recovered and the power supply from the power supply unit 7 can be performed, the battery 6 is set into a chargeable state and the power source is supplied from the power supply unit 7 to each section in the memory 1. The switching operation of the power supply side in the memory is performed by a circuit of the logical OR connection of diodes as shown in FIG. 1. Such a circuit operates by using a difference between the voltage from the power supply unit 7 and the voltage from the battery 6. It is necessary to set the voltage supplied from the battery 6 being a little lower than the DC voltage from the power supply unit 7.

Figure 2:
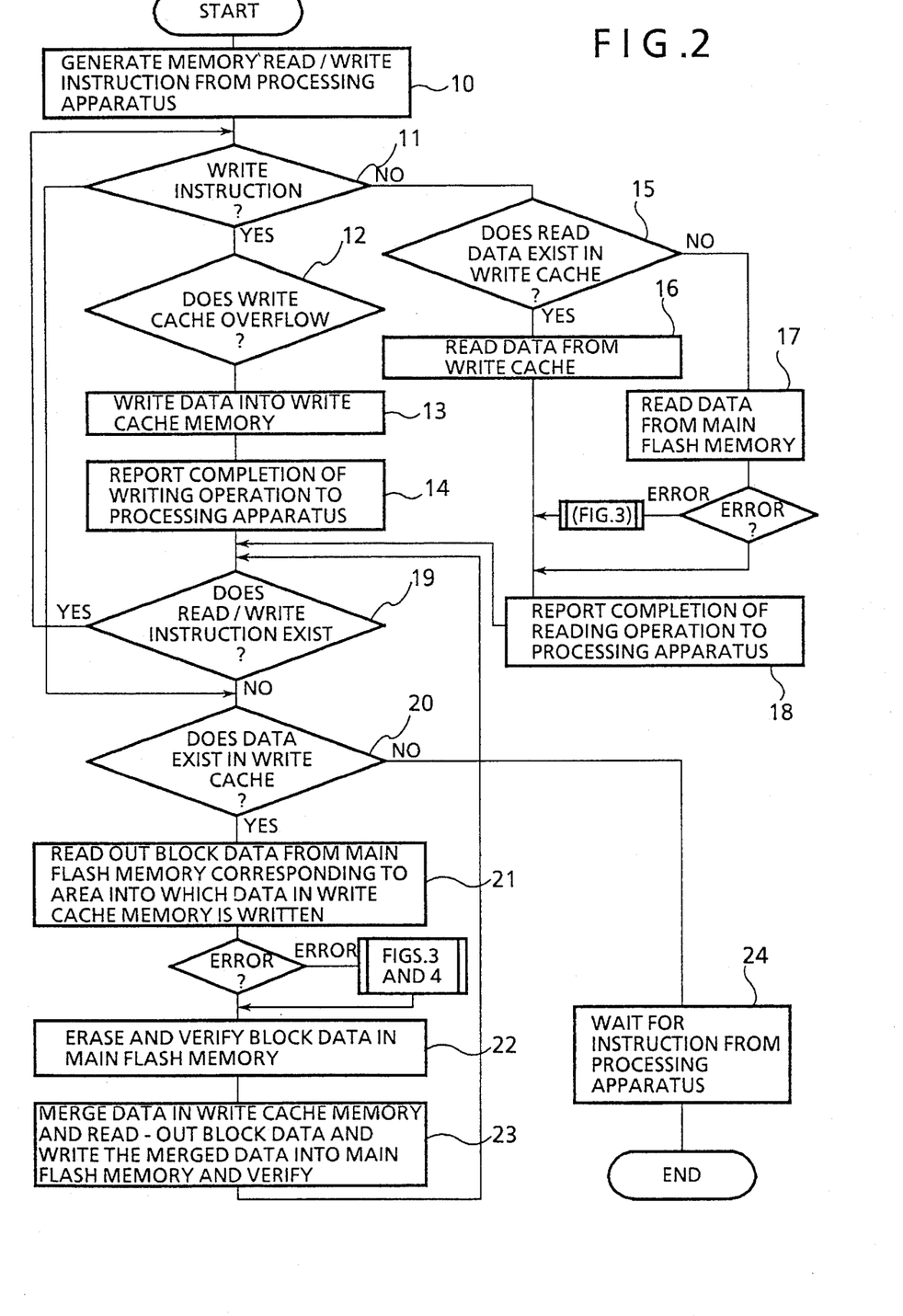
FIG. 2 is a flowchart showing the accessing operation to a memory.
Figure 3:
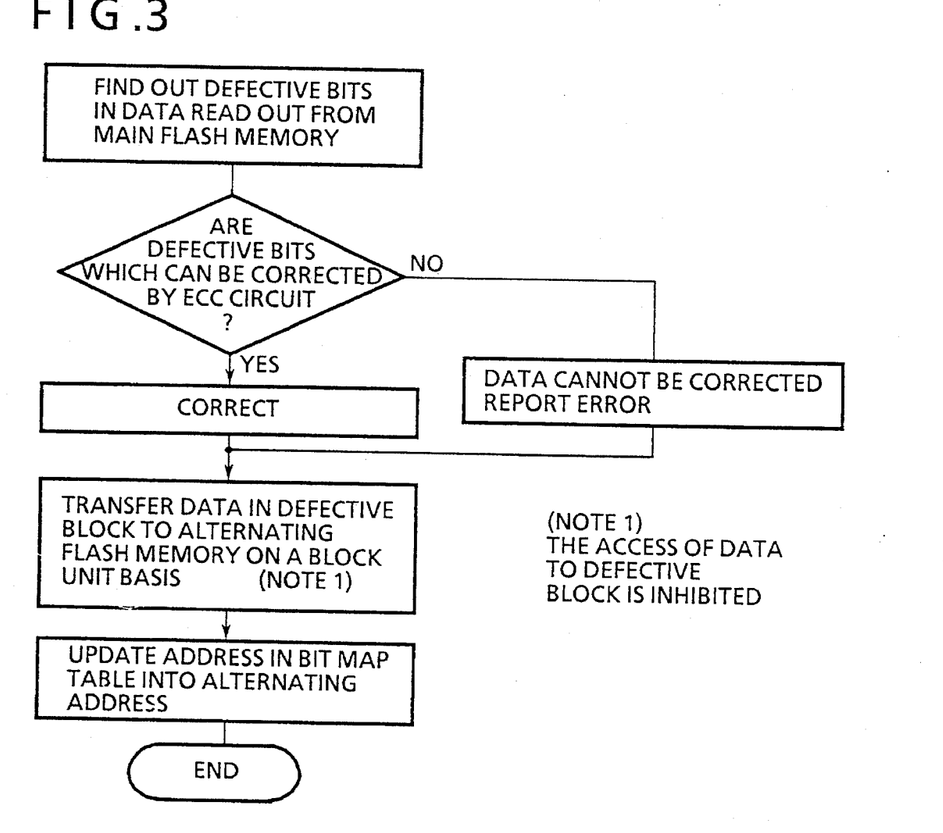
FIG. 3 is a flowchart showing a method of switching to an alternating flash memory by using defective bits in a flash memory as parameters.
Figure 4:
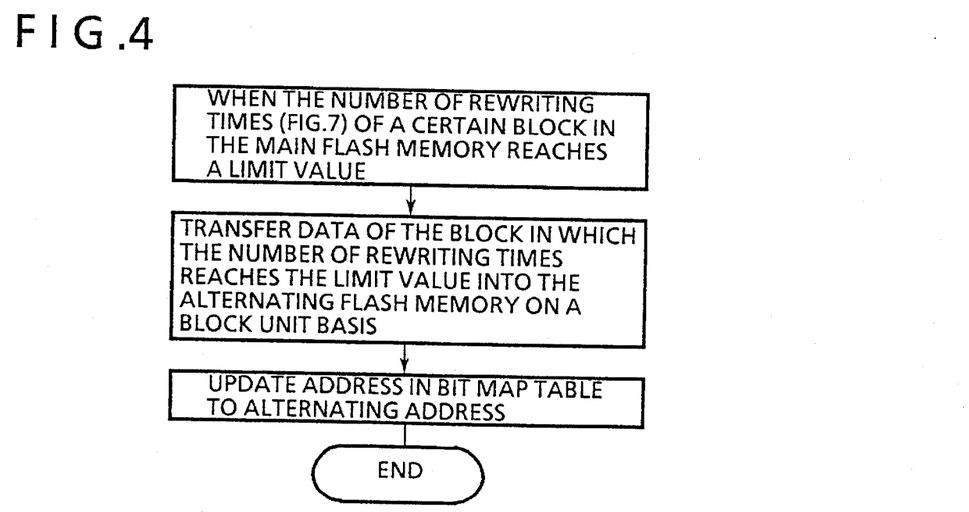
FIG. 4 is a flowchart showing a method of switching to an alternating flash memory by using the number of rewriting times of a main flash memory as a parameter.

FIG. 2 is a flowchart showing the accessing operation to the memory. In the case where data exists in the write cache memory (steps 21 to 23), the block address of the rewriting area in the main flash memory 2 corresponding to the area to write the data in the write cache memory 3 is first recognized from the data in a cache memory management table 40 shown in FIG. 5 and the block data is read out and stored into a data buffer 46 shown in FIG. 5 (step 21). The erasing and verifying operations of the data of the block in the main flash memory 2 are executed (step 22). In the data buffer 46, the data in the write cache memory 3 is merged to the data which has been read out from the main flash memory 2 and the merged data is written into the rewriting area in the main flash memory 2 (step 23). FIGS. 3 and 4 are flowcharts showing methods to switch over from the main flash memory 2 to the alternating flash memory.

FIG. 3 shows the method of alternating the flash memory by using defective bits of the data as parameters.

FIG. 4 shows the method of alternating the flash memory by using the number of rewriting times of data as a parameter. In the case where the memory was alternated by using the method shown in FIG. 4, the number of rewriting times of the block in area 70 of a data format shown in FIG. 7 is initialized to "0".

Figure 5:
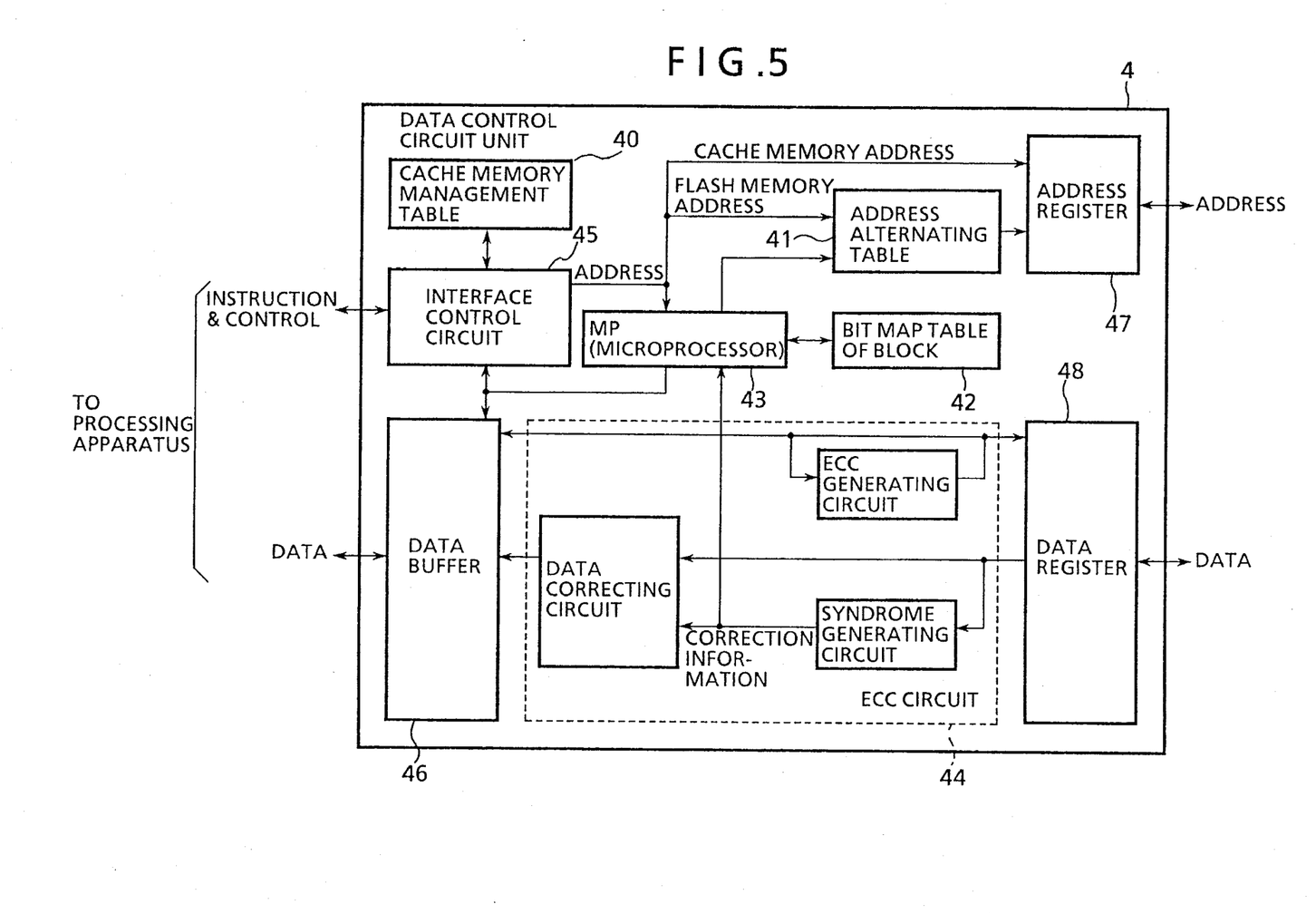
FIG. 5 is a functional block diagram of a data control circuit.
Figure 8:
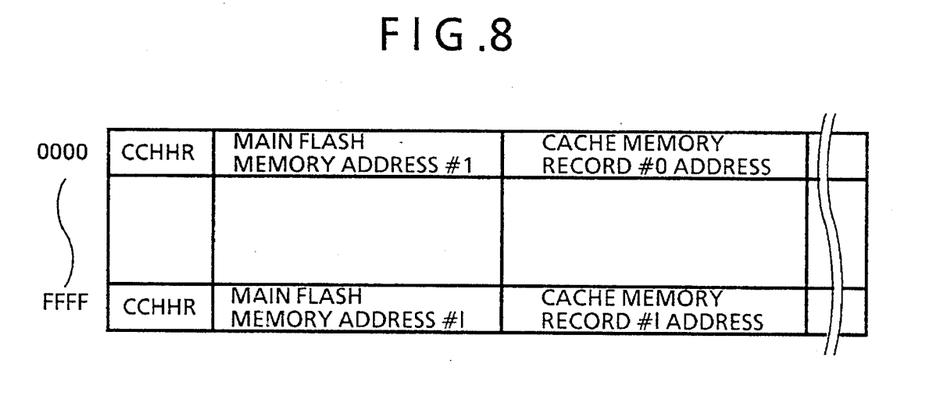
FIG. 8 is a memory map diagram of a cache memory management table.
Figure 9:
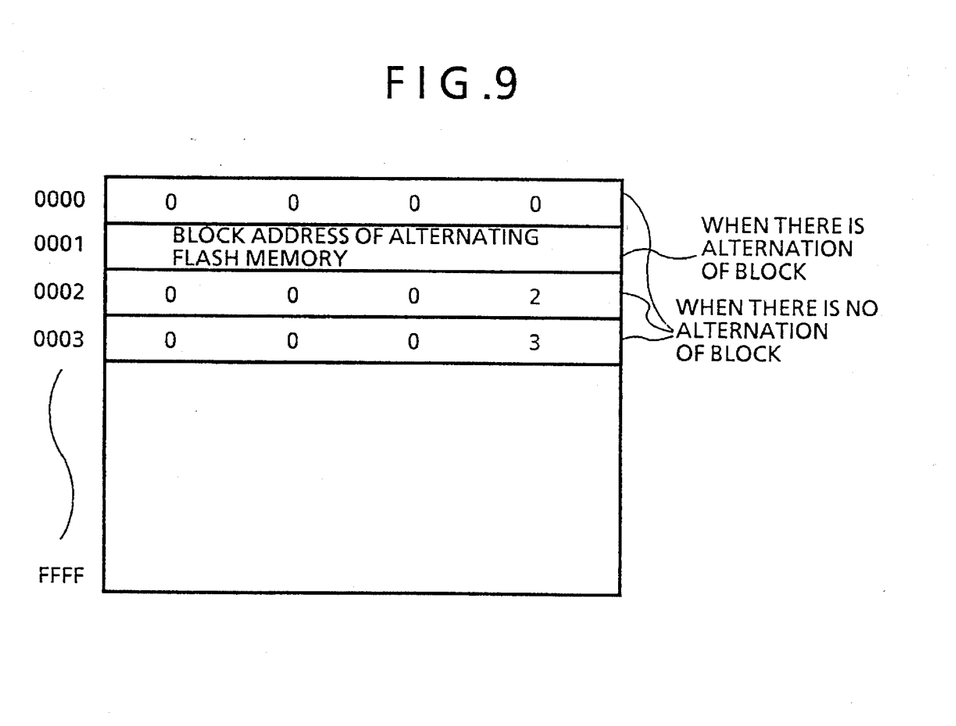
FIG. 9 is a diagram showing a memory map of an address alternating table.

FIG. 5 is a schematic functional block diagram of the data control circuit 4. The cache memory management table 40 is a table of a format shown in FIG. 8 and manages the address of write data from the processing apparatus and can access from a microprocessor 43 via an interface control circuit 45 or the foregoing circuit. An address alternating table 41 is a table of a format shown in FIG. 9 and is constructed by an EEPROM in order to hold the alternating address in the main flash memory 2. When an alternating process of the memory occurs in the main flash memory 2, the microprocessor 43 updates to the alternating address value in the table 41 with reference to a bit map table 42 of the block. Each of the upper bytes at the memory addresses in the main flash memory 2 and alternating flash memory 5 is stored in the table 41. The bit map table 42 of the block is a table indicating whether the block in the main flash memory 2 or alternating flash memory 5 can be used or not. The table 42 is also constructed by an EEPROM. The microprocessor 43 refers to the number of rewriting times of the block read out into the data buffer 46 or the defective bits of the data detected by an ECC circuit 44 and sets a flag into the table 42.

Figure 6:
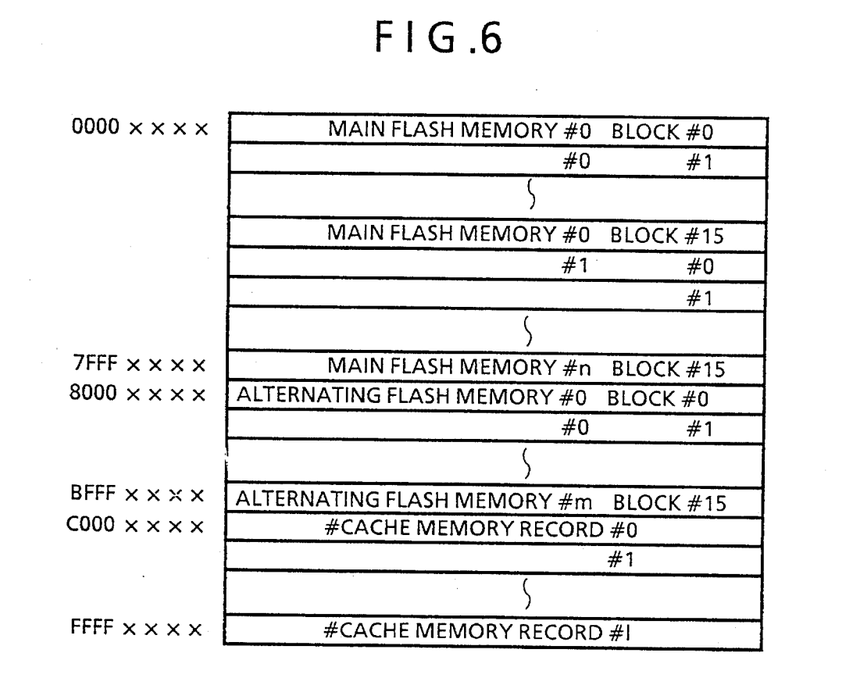
FIG. 6 is a diagram showing an example of memory maps of a main flash memory, an alternating flash memory, and a cache memory.

FIG. 6 is a diagram showing an example of memory maps of the main flash memory 2, alternating flash memory 5, and write cache memory 3. According to this embodiment, since the memory capacity of the write cache memory 3 as a volatile memory can be reduced as compared with the memory capacity of the main flash memory 2 as a non-volatile memory, the whole use efficiency of the memory is improved. The memory capacity of the alternating flash memory 5 can be set to a proper value on the basis of an alternating ratio of the memory. The address in the write cache memory 3 does not need to be set to the address which is continuous to the address in another flash memory. However, when the address in the main flash memory 2 and the address in the alternating flash memory 5 are set to the continuous addresses, the address alternating process in the data control circuit 4 can be easily performed. Further, in the alternating flash memory 5, the addresses distributed into the main flash memory 2 can be also allocated.

Figure 7:
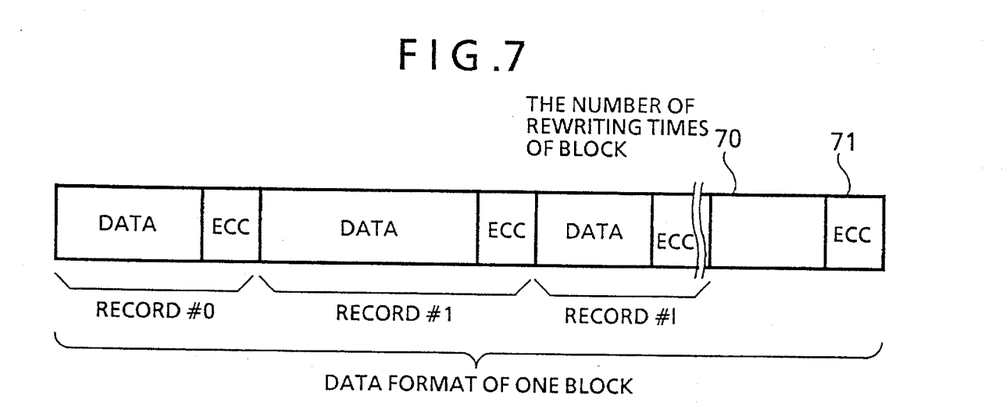
FIG. 7 is a data format diagram of one block in the flash memory.

FIG. 7 is a diagram showing a data format of the block in the flash memory. An ECC 71 in the diagram can be also set to a data ECC of one block as a whole or can be also set to an ECC which is added to only the data indicative of the number 70 of rewriting times of the block.

With the above invention, the semiconductor memory which can improve the use efficiency of the memory and uses the non-volatile memory that can be accessed at a high speed can be constructed.

An access unit of memory data in the present memory will now be described. For the main flash memory 2 or alternating flash memory 5, data is written into one block of the flash memory by the format using a plurality of records as a unit as shown in FIG. 7. The data is read out from the flash memory on a record unit basis or a block unit basis.

On the other hand, the writing and reading operations of data are executed to/from the write cache memory 3 on a unit basis of one record. According to the above method, in spite of the fact that the memory uses a flash memory as a main memory to store data when it is seen from the processing apparatus, the data rewriting operation can be executed at a high speed on a record unit basis without being aware of the block as a rewriting unit of data of the flash memory.

We claim:

1. A semiconductor memory comprising:

a first electrically rewritable non-volatile semiconductor memory;

a volatile cache semiconductor memory whose capacity is equal to or less than a capacity of said first non-volatile semiconductor memory and which is used to temporarily hold data to be written into the non-volatile semiconductor memory;

a data control circuit for writing data from a processor unit connected to said data control circuit into said cache semiconductor memory, for reading out the data from the non-volatile semiconductor memory and the volatile cache semiconductor memory, and for transferring the data from the volatile cache semiconductor memory to the non-volatile semiconductor memory; and a redundant electrically rewritable non-volatile semiconductor memory for providing storage of data normally stored in said first non-volatile semiconductor memory when said first non-volatile semiconductor memory is defective;

wherein said data control circuit comprises:

a second non-volatile memory to store a block bit map table corresponding to a block of a flash EEPROM (electrically erasable programmable read-only memory) which comprises said first non-volatile semiconductor memory; and a third non-volatile memory to store an alternate address when said first non-volatile memory is defective;

wherein said redundant electrically rewritable non-volatile semiconductor memory comprises a redundant flash EEPROM.

2. A semiconductor memory comprising:

a first electrically rewritable non-volatile semiconductor memory;

a volatile cache semiconductor memory whose capacity is equal to or less than a capacity of said first non-volatile semiconductor memory and which is used to temporarily hold data to be written into the non-volatile semiconductor memory;

a data control circuit for writing data from a processor unit connected to said data control circuit into said cache semiconductor memory, for reading out the data from the non-volatile semiconductor memory and the volatile cache semiconductor memory, and for transferring the data from the volatile cache semiconductor memory to the non-volatile semiconductor memory;

a redundant electrically rewritable non-volatile semiconductor memory for providing storage of data normally stored in said first non-volatile semiconductor memory when said first non-volatile semiconductor memory is defective; and a battery to hold the data in the volatile cache semiconductor memory when a power supply for the semiconductor memory is shut off;

wherein said data control circuit comprises:

a second non-volatile memory to store a block bit map table corresponding to a block of a flash EEPROM (electrically erasable programmable read-only memory) which comprises said first non-volatile semiconductor memory; and a third non-volatile memory to store an alternate address when said first non-volatile memory is defective;

wherein said redundant electrically rewritable non-volatile semiconductor memory comprises a redundant flash EEPROM.

3. A semiconductor memory according to claim 1, further comprising an ECC circuit for detecting whether an error is detected in the data read out of said first non-volatile semiconductor memory.

\* \* \* \* \*

UNITED STATES PATENT AND TRADEMARK OFFICE
CERTIFICATE OF CORRECTION

PATENT NO. : 5,515,333
DATED : May 7, 1996
INVENTOR(S) : Fujita, et al.

It is certified that error appears in the above-indentified patent and that said Letters Patent is hereby corrected as shown below:

On the title page, left-hand column:

Following "[62]...Pat. No. 5,359,569" insert

--[30]    Foreign Application Priority Data
    Oct. 29, 1991 [JP]    Japan..........3-282695--.

Signed and Sealed this

Sixteenth Day of February, 1999

Attest:

*Acting Commissioner of Patents and Trademarks*

*Attesting Officer*